(12) United States Patent
Yoshikawa

(10) Patent No.: US 11,240,919 B2
(45) Date of Patent: Feb. 1, 2022

(54) CONNECTING DEVICE AND DISK DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Norio Yoshikawa, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 159 days.

(21) Appl. No.: 16/778,234

(22) Filed: Jan. 31, 2020

(65) Prior Publication Data

US 2021/0076506 A1 Mar. 11, 2021

(30) Foreign Application Priority Data

Sep. 10, 2019 (JP) .............................. JP2019-164840

(51) Int. Cl.
*H05K 1/00* (2006.01)
*H05K 3/36* (2006.01)
(Continued)

(52) U.S. Cl.
CPC ............. *H05K 3/363* (2013.01); *G11B 5/105* (2013.01); *H05K 1/118* (2013.01); *H05K 1/147* (2013.01); *H05K 3/323* (2013.01)

(58) Field of Classification Search
CPC ........ H05K 3/363; H05K 3/323; H05K 1/118; H05K 1/147; G11B 5/105
(Continued)

(56) References Cited

U.S. PATENT DOCUMENTS 6,057,982 A 5/2000 Kloeppel
6,665,149 B2 12/2003 Abe
(Continued)

FOREIGN PATENT DOCUMENTS

JP 2002324371 A 11/2002

OTHER PUBLICATIONS

First Office Action dated Sep. 9, 2021 in corresponding Chinese Patent Application No. 202010045092.0, 12 pages (with Translation).

*Primary Examiner* — Andargie M Aychillhum
(74) *Attorney, Agent, or Firm* — Kim & Stewart LLP

(57) ABSTRACT

A connecting device includes a first flexible printed circuit including a bonding end in which a plurality of connecting pads are provided, a first base portion, a junction portion extending between the bonding end and the first base portion, and a plurality of traces extending from the first base portion to the bonding end, a first connector that is mounted on the first base portion, a second flexible printed circuit including a bonding end in which a plurality of connecting pads are provided, a second base portion, a junction portion extending between the bonding end and the second base portion, and a plurality of traces extending from the second base portion to the bonding end, and a second connector that is mounted on the second base portion. The first connector and the second connector are disposed side by side in a same plane.

18 Claims, 9 Drawing Sheets

(51) Int. Cl.
*H05K 1/11* (2006.01)
*G11B 5/105* (2006.01)
*H05K 3/32* (2006.01)
*H05K 1/14* (2006.01)

(58) Field of Classification Search
USPC .......................................................... 361/749
See application file for complete search history.

(56) References Cited

U.S. PATENT DOCUMENTS

| | | |
|---|---|---|
| 7,385,781 B1 | 6/2008 | Craig et al. |
| 7,518,832 B2 * | 4/2009 | Suzuki ................. G11B 5/4833 360/264.2 |
| 9,129,658 B1 | 9/2015 | Yamamoto |
| 10,008,797 B2 * | 6/2018 | Hassan-Ali ............ H01R 12/79 |
| 2016/0307594 A1 | 10/2016 | Sato |
| 2018/0088838 A1 | 3/2018 | Sato |
| 2020/0211587 A1 | 7/2020 | Yoshikawa |

* cited by examiner

CONNECTING DEVICE AND DISK DEVICE

CROSS-REFERENCE TO RELATED APPLICATION(S)

This application is based upon and claims the benefit of priority from Japanese Patent Application No. 2019-164840, filed Sep. 10, 2019, the entire contents of which are incorporated herein by reference.

FIELD

Embodiments described herein relate generally to a connecting device and a disk device including the connecting device.

BACKGROUND

As a disk device, a hard disk drive (HDD), for example, includes in a casing a magnetic disk, a spindle motor that supports and rotates the magnetic disk, a head actuator supporting a magnetic head, a voice coil motor (VCM) that drives the head actuator, a flexible printed circuit (FPC) unit, and so forth.

The head actuator includes an actuator block with a plurality of arms and a unit bearing attached to the actuator block. One or two suspension assemblies supporting the magnetic head, which are sometimes referred to as head gimbal assemblies (HGAs), are attached to each arm. The FPC unit is connected to the head actuator. The FPC unit includes an FPC with a plurality of signal lines through which various electrical signals and driving signals flow, ground lines, and so forth and a connector provided at one end of the FPC.

With an increase in the storage capacity of the HDD, the number of magnetic disks that are installed is also growing. To accommodate a large number of magnetic disks, what is called a split actuator or multi-actuator, in which a head actuator is divided into a plurality of head actuators, for example, two stacked head actuators which can rotate independently, is proposed. An FPC unit which is connected to such a split actuator is also divided into two FPC units, which are independently connected to the head actuators. Connectors of the two FPC units are stacked and connected to each other via an intermediate connector, for example. Moreover, one connector is connected to a junction connector provided in a junction board that is part of a casing and is connected, via the junction connector, to a control circuit board or the like provided outside the casing.

DETAILED DESCRIPTION

Figure 1:
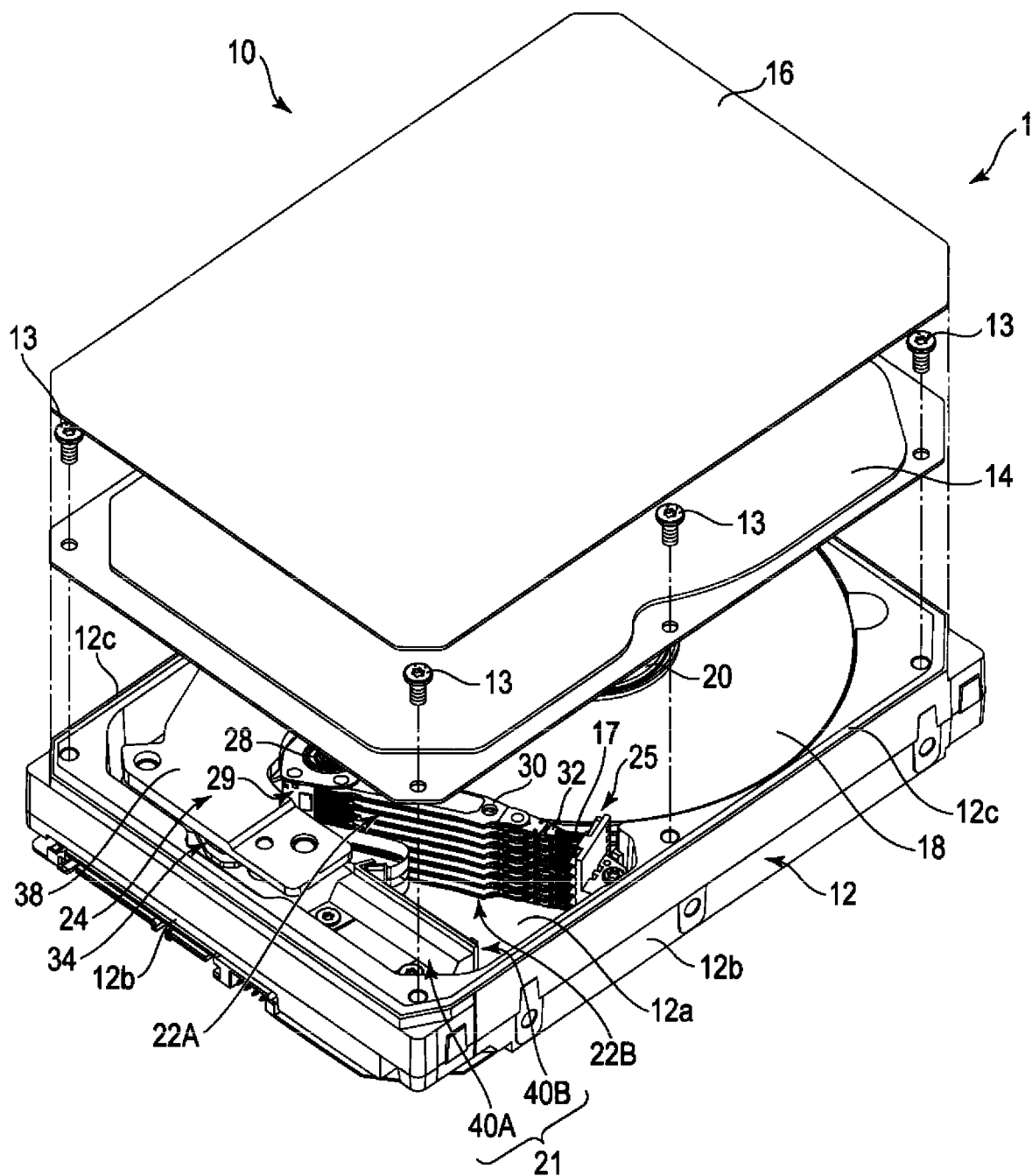
FIG. 1 is a perspective view of a hard disk drive (HDD) according to one embodiment, which is an exploded view of the HDD from which a top cover is detached.

In the FPC units, the number of connectors that are installed is increased. An increase in the number of parts results in a complicated assembly operation. Moreover, if the impedance of the signal lines of one FPC unit is different from the other FPC unit, high-speed transfer performance as the split actuator may be impaired.

Embodiments provide a connecting device by which ease of assembly is improved and a disk device including the connecting device.

In general, according to one embodiment, a connecting device includes a first flexible printed circuit including a bonding end in which a plurality of connecting pads are provided, a first base portion, a junction portion extending between the bonding end and the first base portion, and a plurality of traces extending from the first base portion to the bonding end, a first connector that is mounted on the first base portion, a second flexible printed circuit including a bonding end in which a plurality of connecting pads are provided, a second base portion, a junction portion extending between the bonding end and the second base portion, and a plurality of traces extending from the second base portion to the bonding end, and a second connector that is mounted on the second base portion. The first connector and the second connector are disposed side by side in a same plane.

Hereinafter, a disk device according to an embodiment will be described with reference to the drawings.

It is to be noted that the present disclosure is merely an example and it goes without saying that the present disclosure covers any change or modification which is appropriately made without departing from the spirit of the present disclosure and can be easily conceived by a person skilled in the art. Moreover, the widths, thicknesses, shapes, and so forth of portions in the drawings are sometimes depicted more schematically than their actual widths, thicknesses, shapes, and so forth to give a clearer explanation; they are presented by way of example only and do not limit the interpretation of the present disclosure. Furthermore, in the description and the drawings, an element which is the same as that explained in the already-discussed drawing is identified with the same reference sign and detailed explanations thereof are sometimes omitted as appropriate.

As a disk device, a hard disk drive (HDD) according to an embodiment will be described in detail. FIG. 1 is a perspective view of an HDD according to an embodiment, from which a top cover is detached.

As shown in FIG. 1, the HDD includes an approximately rectangular casing 10. The casing 10 includes a base 12 in the shape of a rectangular box with an opening in the top face thereof, an inner cover 14 that is secured to the base 12 with a plurality of screws 13 and closes the top opening of the base 12, and an outer cover or a top cover 16 that is placed on the inner cover 14 and has an outer edge portion welded to the base 12. The base 12 includes a rectangular bottom wall 12a facing the inner cover 14 with a clearance left therebetween and a side wall 12b standing along the outer edge of the bottom wall 12a and is formed in one piece of aluminum, for example. The side wall 12b includes a pair of long-side walls facing each other and a pair of short-side walls facing each other. In the top end face of the side wall 12b, a fixing rib 12c in the shape of an approximately rectangular frame is provided so as to project therefrom.

The inner cover 14 is formed in the shape of a rectangular plate of stainless steel, for example. The outer edge portion of the inner cover 14 is secured to the top face of the side wall 12b with the screws 13 and is fixed inside the fixing rib 12c. The outer cover 16 is formed in the shape of a rectangular plate of aluminum, for example. The outer cover 16 has a planar size slightly larger than the planar size of the inner cover 14. The entire outer edge portion of the outer cover 16 is welded to the fixing rib 12c of the base 12 such that the outer cover 16 is fixed to the base 12 air-tightly.

In the casing 10, a plurality of magnetic disks 18, for example, six magnetic disks 18 as recording media and a spindle motor 20 that supports and rotates the magnetic disks 18 are provided. The spindle motor 20 is provided on the bottom wall 12a. Each magnetic disk 18 has a diameter of 96 mm (i.e., about 3.5 inches) or less, for example, and has a magnetic recording layer on any one of the upper side and the lower side thereof or both. The magnetic disks 18 are coaxially fitted onto an unillustrated hub of the spindle motor 20 and are fixed to the hub with a clamping spring. The plurality of magnetic disks 18 are stacked parallel to one another with a predetermined space left therebetween and are supported so as to be approximately parallel to the bottom wall 12a of the base 12. The magnetic disks 18 are rotated by the spindle motor 20 at predetermined speed, i.e., rpm (revolutions per minutes).

The number of magnetic disks 18 is not limited to six; for example, the number of magnetic disks 18 may be 7 to 12 or can be increased to 13 or more or decreased to 5 or less.

In the casing 10, a plurality of magnetic heads 17 that write information onto the magnetic disks 18 and read information therefrom and a head actuator assembly (hereinafter referred to as a head actuator) that supports these magnetic heads 17 in such a way that the magnetic heads 17 can move with respect to the magnetic disks 18 are provided. In the present embodiment, the head actuator is a multi-head actuator with a plurality of head actuators that can operate independently, for instance, a first head actuator 22A and a second head actuator 22B. The first and second head actuators 22A and 22B are supported so as to rotate about a common supporting shaft 26 standing on the bottom wall 12a of the base 12.

In the casing 10, voice coil motors (VCMs) 24 that rotate and position the first and second head actuators 22A and 22B, a ramp loading mechanism 25 that holds the magnetic heads 17 in unloaded positions separated from the magnetic disks 18 when the magnetic heads 17 move to the outermost edges of the magnetic disks 18, and a wiring board unit 21 on which electronic components such as a conversion connector are mounted, are provided. As will be described later, the wiring board unit 21 includes as many FPC units as head actuators; in one example, the wiring board unit 21 includes a first FPC unit 40A connected to the first head actuator 22A and a second FPC unit 40B connected to the second head actuator 22B.

Figure 2:
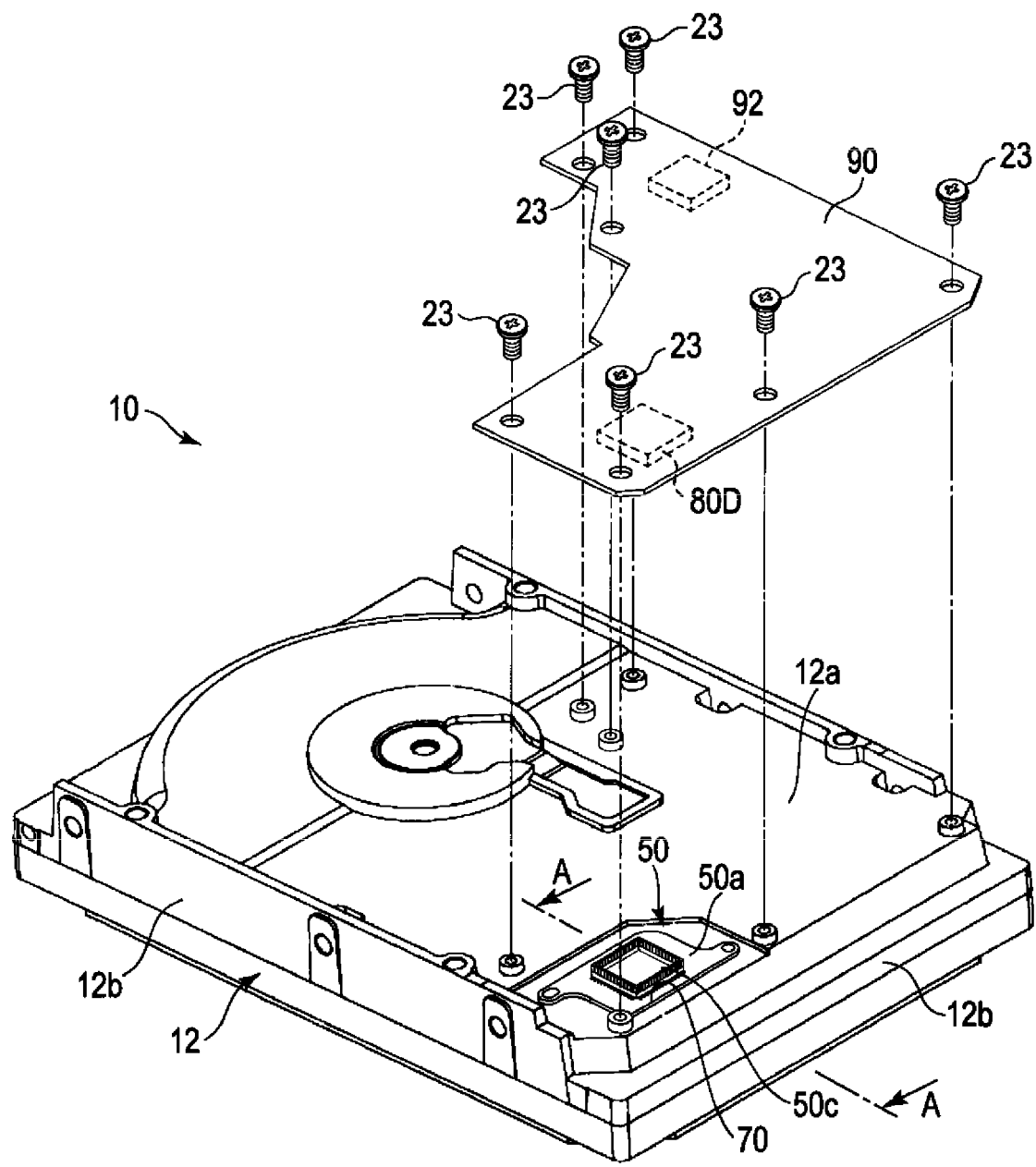
FIG. 2 is an exploded perspective view showing the side of a casing of the HDD where the bottom face thereof is located and a control circuit board.

FIG. 2 is an exploded perspective view showing the side of the casing 10 where the bottom face thereof is located and a control circuit board.

As shown in FIG. 2, the HDD further includes a connector unit 50 fixed to the bottom wall 12a and a control circuit board 90 fixed to the back or outer face of the bottom wall 12a. The connector unit 50 includes a junction circuit board 50a, a pair of first junction connectors 50b mounted on one surface of the junction circuit board 50a, and a second junction connector 50c mounted on the other surface of the junction circuit board 50a. The pair of first junction connectors 50b is electrically connected to the second junction connector 50c via a conductive portion provided in the junction circuit board 50a.

A through hole 70 passing through the bottom wall 12a is provided at a corner of the bottom wall 12a. The junction circuit board 50a of the connector unit 50 is fixed to the outer face of the bottom wall 12a in a position that coincides with the through hole 70 and closes the through hole 70 airtightly. The first junction connectors 50b are disposed inside the casing 10 through the through hole 70. The second junction connector 50c is disposed outside the casing 10.

The control circuit board 90 is secured to the bottom wall 12a with a plurality of screws 23 and faces the outer face of the bottom wall 12a and the connector unit 50. On the inner face of the control circuit board 90 (i.e., a face of the control circuit board 90 on the side thereof facing the outer face of the bottom wall 12a), electronic components such as a semiconductor chip, a connector 80D, a controller 92, and an unillustrated connecting terminal are mounted. The connector 80D is electrically connected to the semiconductor chip, the controller 92, and so forth mounted on the control circuit board 90. Moreover, the connector 80D is fitted onto the second junction connector 50c of the connector unit 50 and is mechanically and electrically connected to the connector unit 50. Furthermore, the connecting terminal of the control circuit board 90 is connected to an unillustrated connecting terminal leading to the spindle motor 20. Therefore, the control circuit board 90 is electrically connected to the spindle motor 20 via the connecting terminal and is electrically connected to the first and second head actuators 22A and 22B and the VCMs 24 via the connector unit 50 and the wiring board unit 21. The controller 92 of the control circuit board 90 controls the operation of the spindle motor 20 and controls the operation of the VCMs 24 and the magnetic heads 17.

Figure 3:
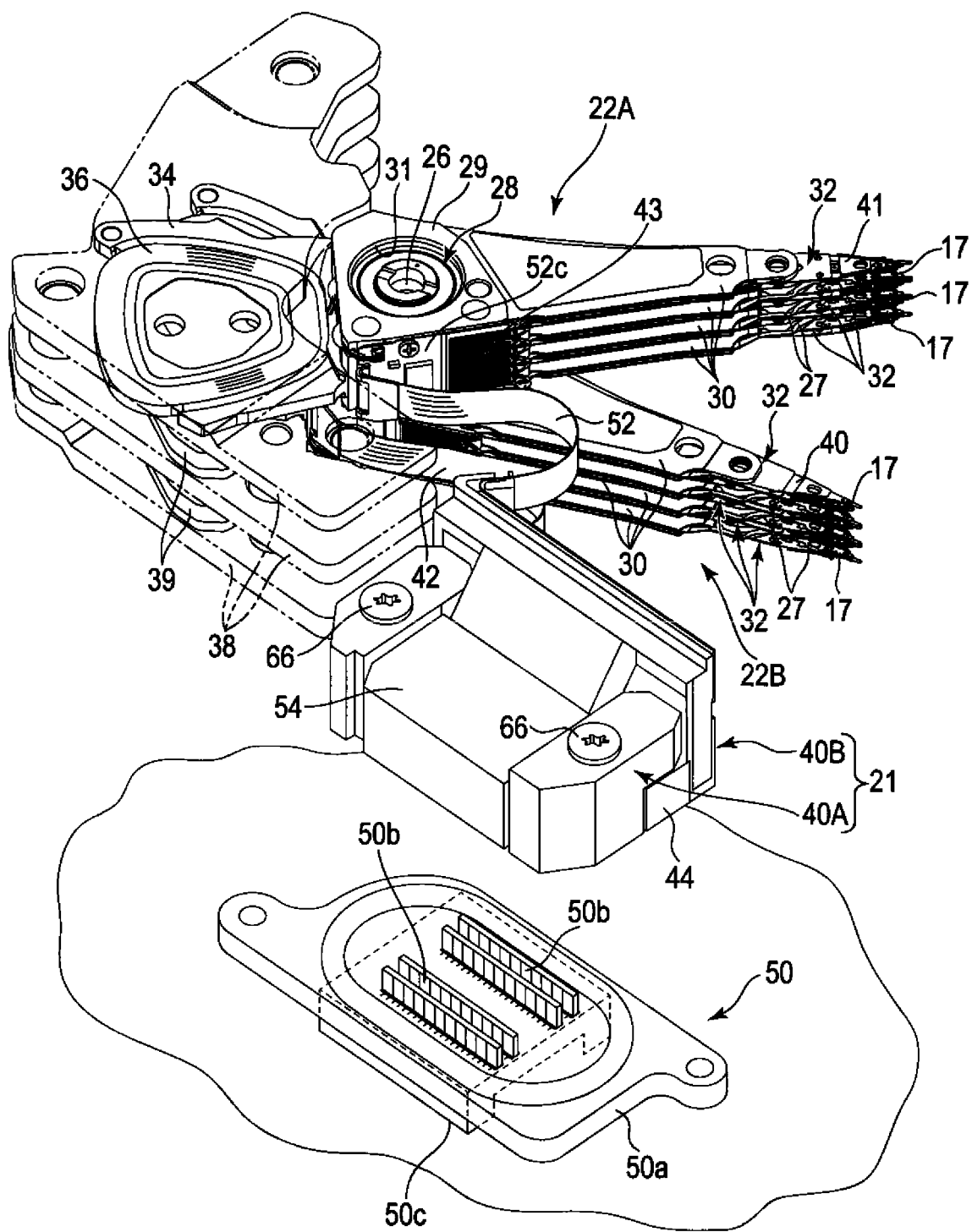
FIG. 3 is a perspective view showing first and second head actuators, a wiring board unit, and a connector unit of the HDD.

Next, the first and second head actuators 22A and 22B and the wiring board unit 21 will be described in detail. FIG. 3 is a perspective view showing the first and second head actuators 22A and 22B, the wiring board unit 21, and the connector unit 50, and FIG. 4 is a perspective view showing the first and second head actuators 22A and 22B, the wiring board unit 21, and the connector unit 50 which are viewed from a direction different from FIG. 3.

Figure 4:
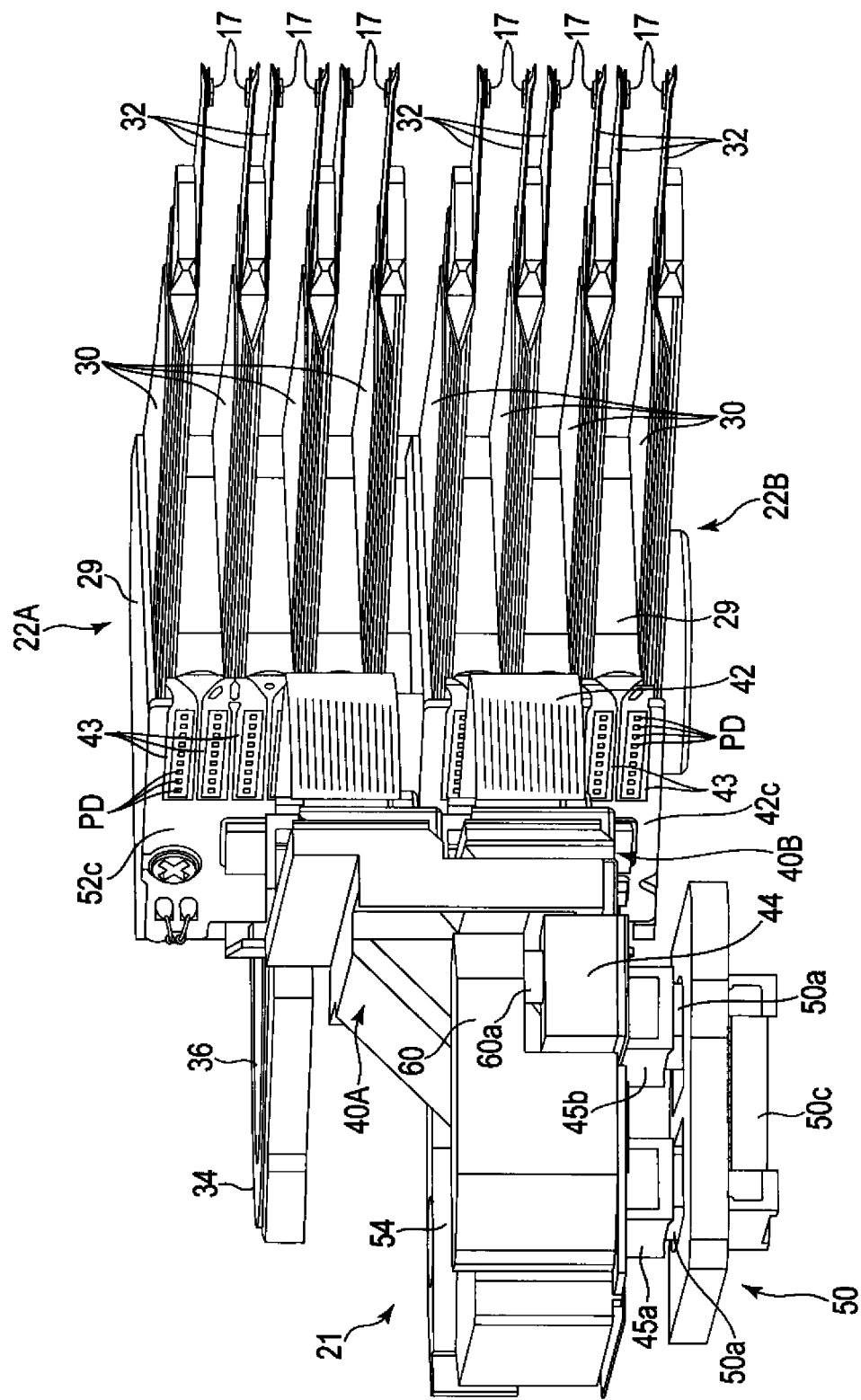
FIG. 4 is a perspective view showing the first and second head actuators, the wiring board unit, and the connector unit which are viewed from a direction different from FIG. 3.

As shown in FIGS. 3 and 4, the first head actuator 22A and the second head actuator 22B are stacked in a direction perpendicular to the bottom wall 12a, and the first head actuator 22A and the second head actuator 22B can rotate independently of each other about the common supporting shaft 26 provided so as to stand on the bottom wall 12a of the base 12. The first head actuator 22A and the second head actuator 22B have almost the same structure and almost the same size. In one example, the head actuator disposed on the upper side (i.e., the side where the inner cover 14 and the top cover 16 are located) is assumed to be the first head actuator 22A, and the head actuator disposed on the lower side (i.e., the side where the bottom wall 12a is located) is assumed to be the second head actuator 22B.

The first head actuator 22A includes a first actuator block 29, four arms 30 extending from the actuator block 29, head suspension assemblies 32 attached to the arms 30, which are sometimes referred to as head gimbal assemblies (HLAs), and the magnetic heads 17 supported by the head suspension assemblies 32. The actuator block 29 has an inner hole 31, and a bearing unit 28 is inserted into the inner hole 31. The actuator block 29 is rotatably supported on the supporting shaft 26 by the bearing unit 28.

In the present embodiment, the actuator block 29 and the four arms 30 are formed in one piece of aluminum or the like and make up what is called an E block. Each arm 30 is formed in the shape of a long and narrow flat plate, for example, and extends from the actuator block 29 in a direction orthogonal to the supporting shaft 26. The four arms 30 are provided parallel to one another with a clearance left therebetween.

The first head actuator 22A includes a supporting frame 34 extending from the actuator block 29 in a direction opposite to the arms 30. A voice coil 36 is supported by the supporting frame 34. The voice coil 36 is located between a pair of yokes 38 installed on the base 12 and makes up the VCM 24 with these yokes 38 and a magnet 39 fixed to any one of the yokes 38.

The first head actuator 22A includes six head suspension assemblies 32, and these head suspension assemblies 32 are attached to the extension ends of the arms 30. The plurality of head suspension assemblies 32 include an up-head suspension assembly that supports the magnetic head 17 in such away that the magnetic head 17 faces upward and a down-head suspension assembly that supports the magnetic head 17 in such away that the magnetic head 17 faces downward. The up-head suspension assembly is obtained by disposing a head suspension assembly having a given structure so as to face upward, and the down-head suspension assembly is obtained by disposing a head suspension assembly having the same structure so as to face downward. In the present embodiment, in the first head actuator 22A, the down-head suspension assembly is attached to the uppermost arm 30 and the up-head suspension assembly is attached to the lowermost arm 30. Two head suspension assemblies 32: the up-head suspension assembly and the down-head suspension assembly are attached to each of the other two arms 30.

Each head suspension assembly 32 includes: a suspension 41 made up of an approximately rectangular base plate and a load beam in the shape of a long and narrow flat spring; and a flexure or a wiring member 27, which is provided on the suspension 41, in the shape of a long and narrow band. The flexure 27 includes: a metal plate or a backing layer such as stainless steel; an insulating layer formed on the metal plate; a conductive layer that is formed on the insulating layer and forms a plurality of traces or a wiring pattern; and a cover layer, a protective layer, or an insulating layer covering the conductive layer and is a stacked plate in the shape of a long and narrow band. The flexure 27 has a tip-side portion and a base end-side portion. The tip-side portion of the flexure 27 is attached to the front surface of the suspension 41. The flexure 27 includes a displaceable gimbal portion or an elastic supporting portion located at an extension end portion of the suspension 41. The magnetic head 17 is mounted on the gimbal portion. The traces of the flexure 27 are electrically connected to a read element, a write element, a heater, and other members of the magnetic head 17. The head suspension assembly 32 may include a piezoelectric element or the like which functions as a microactuator. In this case, the piezoelectric element is disposed on the flexure 27 near the magnetic head 17 and is electrically connected to the traces of the flexure 27.

The base end-side portion of the flexure 27 goes out from the side edge of the suspension 41 and then extends to the base end of the arm 30 and the actuator block 29 through a slit formed in the side face of the arm 30. A connecting end or a tail connecting terminal portion 43 of the flexure 27 is formed at the rear end of the base end-side portion. The connecting end 43 is formed in the shape of a long and narrow rectangle. A plurality of connecting terminals or pads PD, for example, nine connecting terminals or pads PD are provided in the connecting end 43. These connecting terminals PD are electrically connected to the magnetic head 17 and the piezoelectric element via the traces of the flexure 27.

Moreover, a bonding end 52c of a flexible printed circuit, which will be described later, is disposed on an installation surface of the actuator block 29. The connecting end 43 of the flexure 27 is bonded to the bonding end 52c. The connecting terminals PD of each connecting end 43 are soldered to unillustrated connecting terminals provided in the bonding end 52c and are electrically and mechanically bonded to the bonding end 52c. An input-output terminal of the voice coil 36 is soldered to a connecting pad provided in the bonding end 52c.

On the other hand, the second head actuator 22B has almost the same structure as the first head actuator 22A. That is, as shown in FIGS. 3 and 4, the second head actuator 22B includes a second actuator block 29 into which a bearing unit is incorporated, four arms 30 extending from the actuator block 29, six head suspension assemblies 32 attached to the arms 30, the magnetic heads 17 mounted on the head suspension assemblies, and a supporting frame 34 supporting a voice coil 36.

The actuator block 29 is rotatably supported on the supporting shaft 26 via the bearing unit. The actuator block 29 is supported by a base end portion of the supporting shaft 26 (i.e., half of the supporting shaft 26 on the side thereof where the bottom wall 12a is located) and is coaxially disposed below the first actuator block 29. The second actuator block 29 faces the first actuator block 29 with a slight clearance left therebetween.

In the second head actuator 22B, the down-head suspension assembly is attached to the uppermost arm 30 and the up-head suspension assembly is attached to the lowermost arm 30. Two head suspension assemblies 32: the up-head suspension assembly and the down-head suspension assembly are attached to each of the other two arms 30.

A flexure 27 of each head suspension assembly 32 has a connecting end 43 located on the actuator block 29. A bonding end 42c of a flexible printed circuit, which will be described later, is disposed on an installation surface of the actuator block 29. The connecting end 43 of each flexure 27 is bonded to the bonding end 42c. Connecting terminals PD of the connecting end 43 are soldered to unillustrated connecting terminals provided in the bonding end 42c and are electrically and mechanically bonded to the bonding end 42c.

The voice coil 36 of the second head actuator 22B is located between a pair of yokes 38 installed on the base 12 and makes up the VCM 24 with these yokes 38 and a magnet 39 fixed to any one of the yokes 38.

The VCM 24 that drives the first head actuator 22A and the VCM 24 that drives the second head actuator 22B are provided independently of each other. This makes it possible to rotate the first head actuator 22A and the second head actuator 22B independently.

Next, the structure of the wiring board unit 21 will be described.

The wiring board unit 21 as the connecting device includes a plurality of flexible printed circuit (FPC) units; in one example, the wiring board unit 21 includes as many FPC units as head actuators. In this example, the wiring board unit 21 includes the first FPC unit 40A connected to the first head actuator 22A and the second FPC unit 40B connected to the second head actuator 22B.

Figure 5:
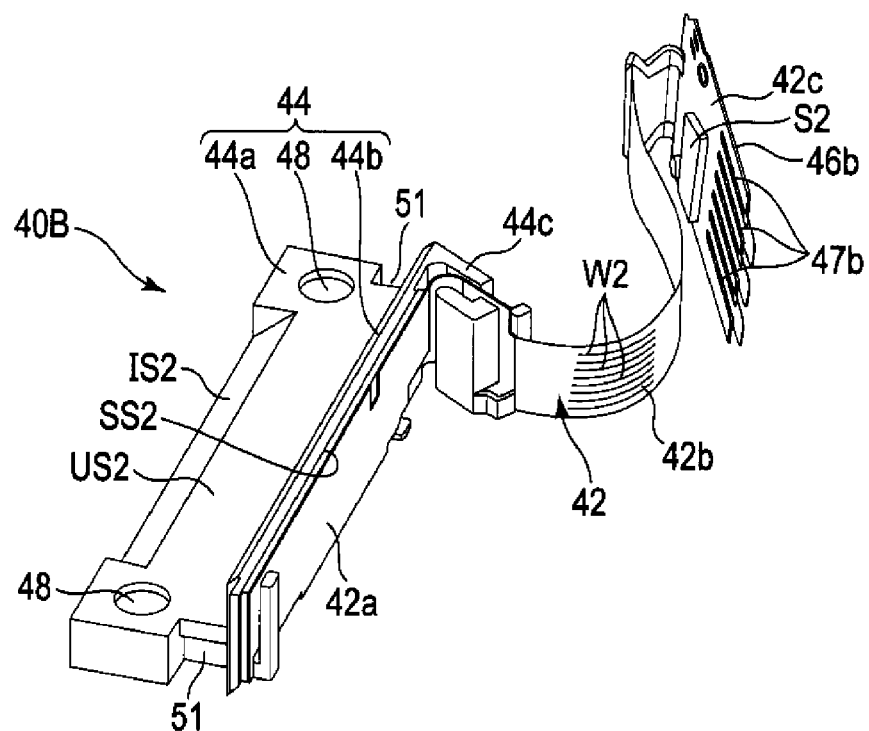
FIG. 5 is a perspective view showing a second FPC unit of the wiring board unit.
Figure 6:
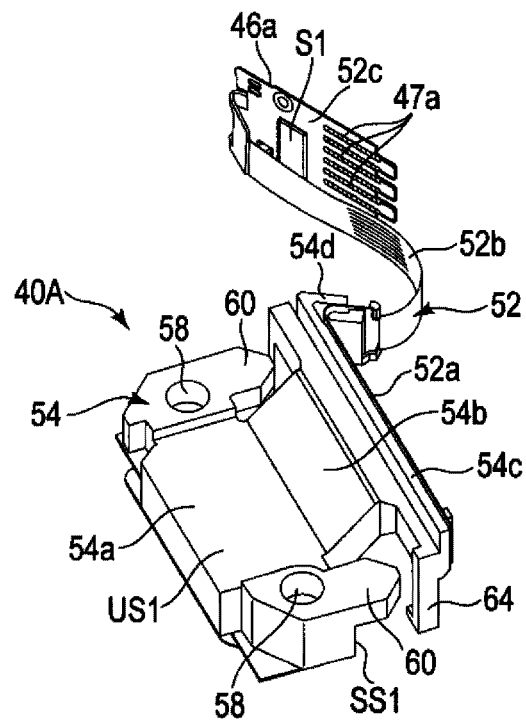
FIG. 6 is a perspective view showing a first FPC unit of the wiring board unit.
Figure 7:
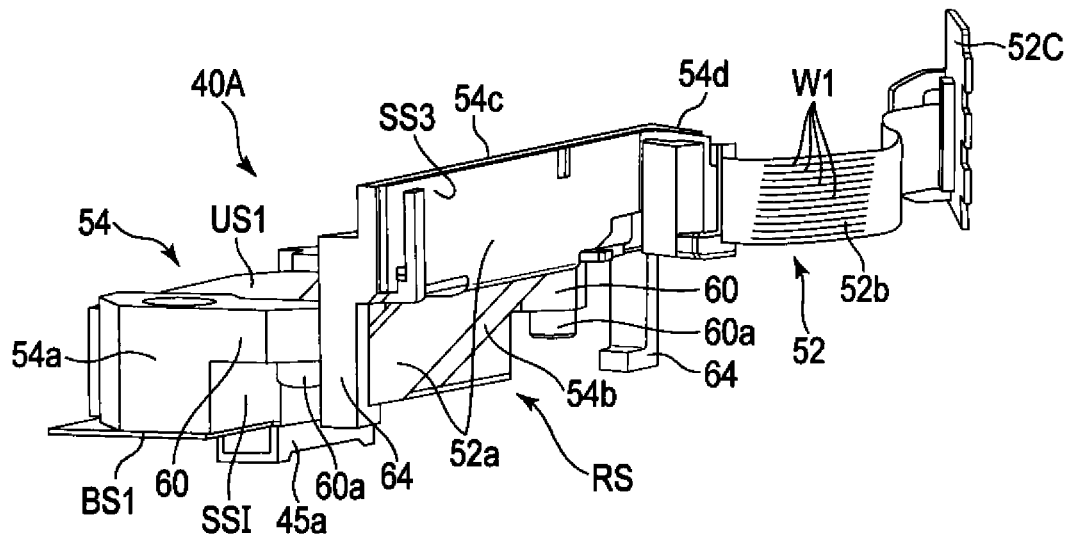
FIG. 7 is a perspective view of the first FPC unit which is viewed from a direction different from FIG. 6.
Figure 8:
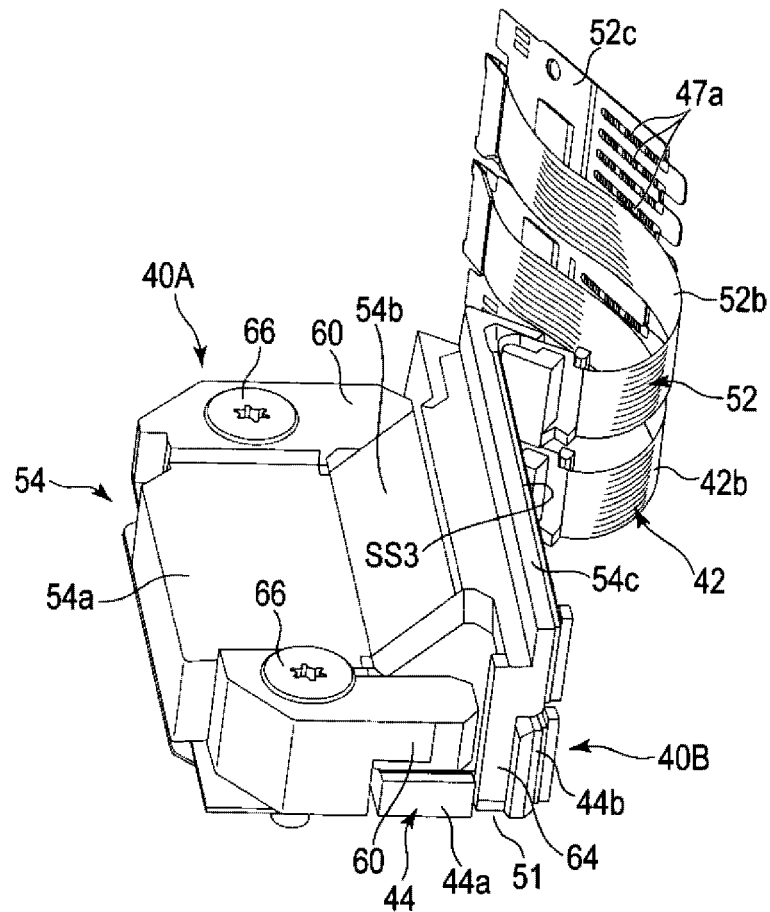
FIGS. 8 and 9 are perspective views showing the first FPC unit and the second FPC unit that are engaged.

FIG. 5 is a perspective view showing the second FPC unit 40B, FIG. 6 is a perspective view showing the first FPC unit 40A, and FIG. 7 is a perspective view of the first FPC unit 40A which is viewed from a direction different from FIG. 6. FIG. 8 is a perspective view showing the first FPC unit 40A and the second FPC unit 40B that are engaged, and FIG. 9 is a perspective view of the engaged first FPC unit 40A and second FPC unit 40B, which are viewed from a direction different from FIG. 8.

As shown in FIG. 5, the second FPC unit 40B includes a second flexible printed circuit (FPC) 42, a second connector 45b mounted at one end of the second FPC 42, and a second support 44 fixed to the one end of the second FPC 42. The second FPC includes, as integral parts thereof, an approximately rectangular base portion 42a, a band-like junction portion 42b extending from one side edge of the base portion 42a, and the bonding end 42c which is approximately rectangular and seamlessly provided at the extension end of the junction portion 42b. The second FPC 42 includes: an insulating layer such as polyimide; a conductive layer that is formed on the insulating layer and forms a plurality of traces W2, connecting pads, and so forth; and a protective layer covering the conductive layer. A reinforcing sheet 46b having almost the same shape as the bonding end 42c is affixed to one face (i.e., the back face) of the bonding end 42c. Moreover, a semiconductor device S2 such as a head IC is mounted on the other face (i.e., the front face) of the bonding end 42c. Furthermore, a plurality of connecting pads 47b are provided on the front face of the bonding end 42c so as to be exposed therefrom. The second connector 45b is mounted on the base portion 42a. The second connector 45b is electrically connected to the semiconductor device S2 and the connecting pads 47b of the bonding end 42c via the plurality of traces W2 of the second FPC 42.

Figure 9:
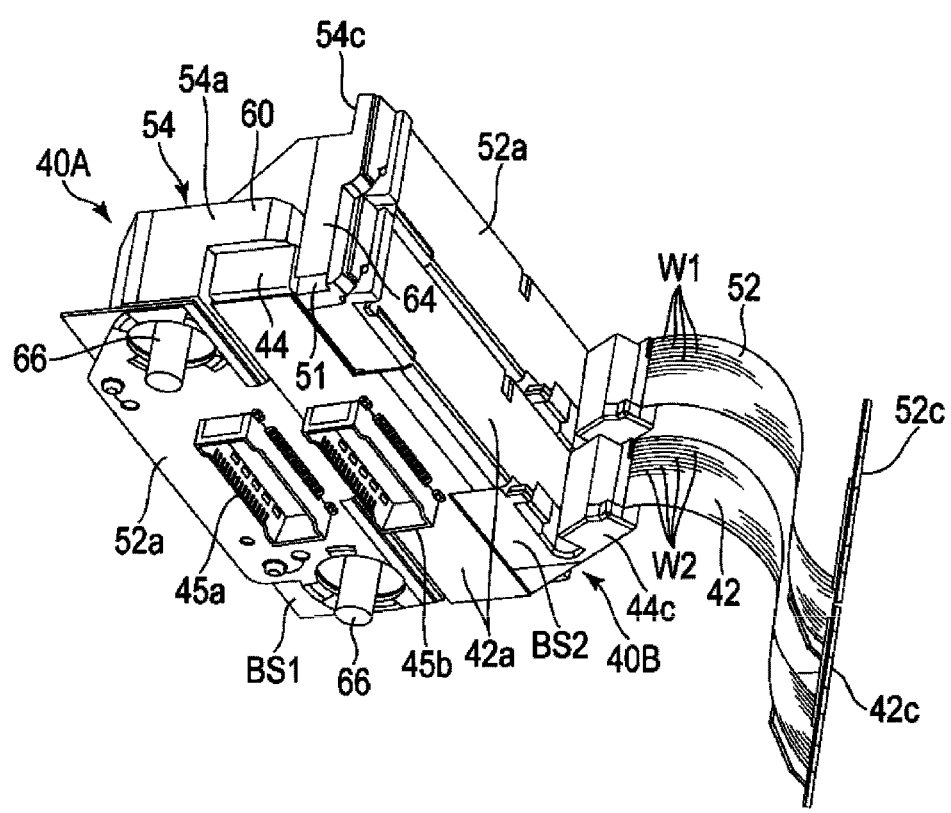

As shown in FIGS. 5 and 9, the second support 44 includes a main body 44a in the shape of a rectangular plate and a rectangular side plate 44b which stands on the main body 44a at an approximately right angle thereto, which are formed in one piece of metal or synthetic resin. The main body 44a includes a rectangular flat bottom face BS2, a rectangular top face US2 that faces the bottom face BS2, and an inclined face IS2 formed by cutting one side portion of the top face US2. The main body 44a includes circular positioning recesses 48 formed at both ends of the top face US2 in the longitudinal direction thereof and stepped engaging recess portions 51 formed at both ends of the main body 44a in the longitudinal direction thereof. The side plate 44b includes an approximately rectangular side face SS2 located at an approximately right angle to the bottom face BS2 of the main body 44a. Moreover, the sideplate 44b includes, as an integral part thereof, a folded hook 44c protruding from one edge of the side plate 44b in the longitudinal direction thereof.

The base portion 42a of the second FPC 42 is affixed to the bottom face BS2 and the side face SS2 of the second support 44 in a state in which the base portion 42a is bent at an approximately right angle at an intermediate part thereof, and is fixed to the second support 44. The second connector 45b mounted on the base portion 42a is disposed on the bottom face BS2 with the base portion 42a sandwiched therebetween. Moreover, the junction portion 42b of the second FPC 42 extends from one side edge of the base portion 42a, that is, one edge of the side plate 44b along the folded hook 44c and extends outward from the second support 44 in a state in which the junction portion 42b is folded back by the folded hook 44c toward the side plate 44b.

As shown in FIGS. 3 and 4, the second FPC unit 40B structured as described above is connected to the second head actuator 22B by affixing and securing the bonding end 42c of the second FPC 42 to the installation surface of the second actuator block 29 with screws, and the second FPC unit 40B is electrically connected to the magnetic heads 17 of the second head actuator 22B via the flexures 27 by bonding the connecting ends 43 of the flexures 27 to the bonding end 42c.

On the other hand, as shown in FIGS. 6 and 7, the first FPC unit 40A includes a first flexible printed circuit (FPC) 52, a first connector 45a mounted at one end of the first FPC 52, and a first support 54 fixed to the one end of the first FPC 52. The first FPC 52 includes, as integral parts thereof, an approximately rectangular base portion 52a, a band-like junction portion 52b extending from one side edge of the base portion 52a, and the bonding end 52c which is approximately rectangular and seamlessly provided at the extension end of the junction portion 52b. The first FPC 52 includes: an insulating layer such as polyimide; a conductive layer that is formed on the insulating layer and forms a plurality of traces W1, connecting pads, and so forth; and a protective layer covering the conductive layer.

A reinforcing sheet 46a having almost the same shape as the bonding end 52c is affixed to one face (i.e., the back face) of the bonding end 52c. Moreover, a semiconductor device S1 such as a head IC is mounted on the other face (i.e., the front face) of the bonding end 52c. Furthermore, a plurality of connecting pads 47a are provided on the front face of the bonding end 52c so as to be exposed therefrom. The first connector 45a is mounted on the base portion 42a. The first connector 45a is electrically connected to the semiconductor device S1 and the connecting pads 47a of the bonding end 52c via the plurality of traces W1 of the first FPC 52.

The first support 54 includes a main body 54a in the shape of a rectangular plate, an inclined plate 54b that extends from one side portion of the main body 54a and is inclined with respect to the main body 54a, and a rectangular side plate 54c coupled to the extension end of the inclined plate 54b, which are formed in one piece of metal or synthetic resin.

The main body 54a includes a rectangular flat bottom face BS1, a rectangular top face US1 that faces the bottom face BS1, and a rectangular side face SS1 that intersects the bottom face BS1 and the top face US1. The main body 54a includes a pair of through holes 58 formed at both ends of the main body 54a in the longitudinal direction thereof and a pair of elastically deformable pressing arms 60 extending from both ends of the side face SS1 in the longitudinal direction thereof in a direction orthogonal to the side face SS1. Each pressing arm 60 includes, as an integral part thereof, a pressing protrusion 60a provided on the underside of the extension end of the pressing arm 60.

The inclined plate 54b extends obliquely upward from the side face SS1 of the main body 54a and forms an inclined face inclined at an angle of, for example, 15 to 75 degrees with respect to the top face US1 of the main body 54a. Moreover, the inclined plate 54b is located between the pair of pressing arms 60.

The side plate 54c is coupled to the extension end of the inclined plate 54b and is disposed so as to be separated from the main body 54a. The side plate 54c includes an approximately rectangular side face SS3 which is located at an approximately right angle to the bottom face BS2 of the main body 54a. Moreover, the side plate 54c includes, as integral parts thereof, a pair of engaging arms 64 provided at both ends of the side plate 54c in the longitudinal direction thereof and a folded hook 54d protruding from one edge of the side plate 54c in the longitudinal direction thereof. The engaging arms 64 extend from an end of the side plate 54c approximately parallel to the side face SS3 toward the bottom face BS1 of the main body 54a. An engaging hook is provided at the extension end of each engaging arm 64. The pair of engaging arms 64 is elastically deformable and is provided in such a way that the pair of engaging arms 64 can engage the main body 44a of the second FPC unit 40B described earlier.

In the first support 54, a region facing the side face SS1 of the main body 54a and the inclined face of the inclined plate 54b forms a housing region RS that can house at least part of the second support 44 of the second FPC unit 40B, in this example, the main body 44a.

As shown in FIGS. 6, 7, and 9, the base portion 52a of the first FPC 52 is affixed to the bottom face BS1, the inclined face, and the side face SS3 of the first support 54 in a state in which the base portion 52a is bent at two or more points, and is fixed to the first support 54. The first connector 45a mounted on the base portion 52a is disposed on the bottom face BS1 with the base portion 52a sandwiched therebetween. Moreover, the junction portion 52b of the first FPC 52 extends from one side edge of the base portion 52a, that is, one edge of the side plate 54c along the folded hook 54d and extends outward from the first support 54 in a state in which the junction portion 52b is folded back by the folded hook 54d toward the side plate 54c.

In the first FPC 52, the length of each trace W1 from the first connector 45a to the bonding end 52c is nearly equal to the length of each trace W2 from the second connector 45b to the bonding end 42c in the second FPC 42. This makes the impedance of the traces W1 of the first FPC 52 and the impedance of the traces W2 of the second FPC 42 approximately equal to each other.

As shown in FIGS. 3 and 4, the first FPC unit 40A structured as described above is connected to the first head actuator 22A by affixing and securing the bonding end 52c of the first FPC 52 to the installation surface of the first actuator block 29 with screws, and the first FPC unit 40A is electrically connected to the magnetic heads 17 of the first head actuator 22A via the flexures 27 by bonding the connecting ends 43 of the flexures 27 to the bonding end 52c.

At the time of assembly of the HDD, by bringing about the engagement between the first support 54 of the first FPC unit 40A and the second support 44 of the second FPC unit 40B, a coupling state between the first support 54 and the second support 44 is maintained. That is, as shown in FIGS. 8 and 9, by disposing the first support 54 on the second support 44 and pressing the first support 54 against the second support 44, the main body 44a and the side plate 44b of the second support 44 are housed in the housing space portion RS of the first support 54. In this case, the pair of engaging arms 64 of the first support 54 is pushed into the engaging recess portions 51 of the second support 44 and the engaging hooks of the engaging arms 64 are brought into engagement with the engaging recess portions 51. At the same time, the pressing protrusions 60a of the pair of pressing arms 60 of the first support 54 engage the positioning recesses 48 of the second support 44, whereby the pair of pressing arms 60 is positioned with respect to the second support 44 and presses the second support 44 via the pressing protrusions 60a. By pressing the second support 44, the engaging arms 64 and the second support 44 are brought into tighter engagement with each other. Moreover, the inclined face IS2 of the second support 44 faces or abuts the inclined plate 54b of the first support 54 with the FPC sandwiched therebetween. As a result, the second support 44 is coupled to the first support 54 and held thereby.

In a state in which the second support 44 is coupled to the first support 54, the bottom face BS1 of the first support 54 and the bottom face BS2 of the second support 44 are located side by side in almost the same plane. As a result, the first connector 45a and the second connector 45b are also located side by side in almost the same plane. The side face SS3 of the side plate 54c of the first support 54 and the side face SS2 of the second support 44 are located side by side in almost the same plane orthogonal to the bottom face BS1. Furthermore, the folded hook 54d of the side plate 54c and the folded hook 44c of the side plate 44b are located and aligned in almost the same plane.

At the time of assembly of the HDD, the first support 54 and the second support 44 are fixed to the bottom wall 12a of the casing 10 in a state in which the first support 54 and the second support 44 are coupled to each other as described above, and the first connector 45a and the second connector 45b are connected to the first junction connectors 50b of the connector unit 50.

Figure 10:
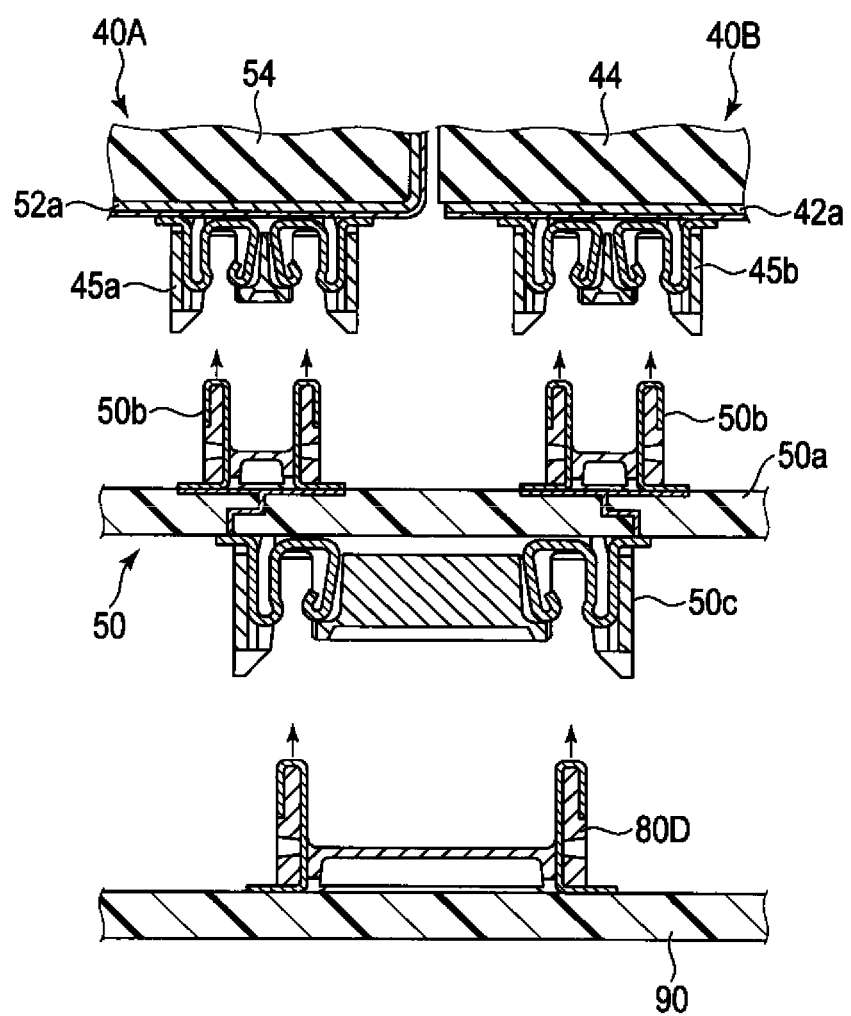
FIG. 10 is a sectional view schematically showing connectors of the wiring board unit, connectors of a junction board unit, and a connector on the control circuit board that are not connected.
Figure 11:
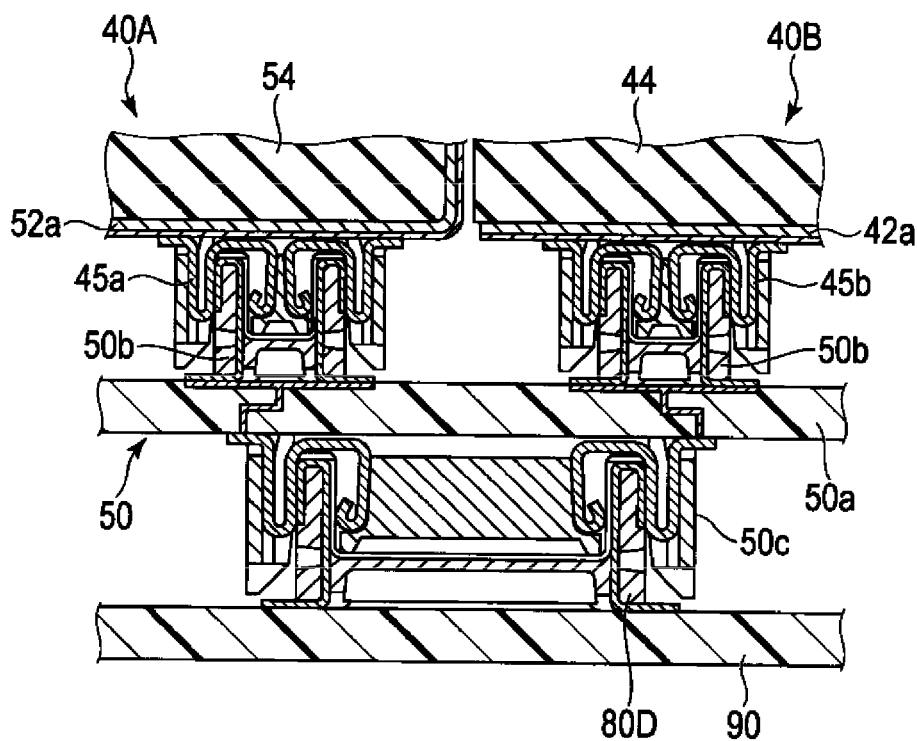
FIG. 11 is a sectional view of the connectors of the wiring board unit, the connectors of the junction board unit, and the connector on the control circuit board that are connected.

FIG. 10 is a sectional view showing the placement relationship among a plurality of connectors before the connectors are connected to one another, and FIG. 11 is a sectional view taken along the line A-A of FIG. 2, showing a state in which the plurality of connectors are connected to one another.

As shown in FIGS. 10 and 11, the first connector 45a of the first support 54 and the second connector 45b of the second support 44 face the pair of first junction connectors 50b of the connector unit 50, and, by pushing the first support 54 and the second support 44 toward the bottom wall 12a, the first connector 45a and the second connector 45b are fitted onto the first junction connectors 50 and electrically connected thereto. The first support 54 is secured to the bottom wall 12a of the casing 10 with fastening screws 66 (see FIG. 3) inserted into the through holes 58 and maintains the connected state of the first connector 45a. At the same time, the pair of pressing arms 60 of the first support 54 presses the second support 44 toward the first junction connector 50b. Therefore, the second connector 45b is pressed by the second support 44 and can maintain the state in which the second connector 45b is connected to the first junction connector 50b.

On the other hand, the connector 80D of the control circuit board 90 faces the second junction connector 50c of the connector unit 50, and, by pushing the control circuit board 90 toward the outer face of the bottom wall 12a, the connector 80D is fitted into the second junction connector 50c and electrically connected thereto. Moreover, by securing the control circuit board 90 to the bottom wall 12a with screws, the connected state of the connector 80D is maintained.

By connecting the connectors as described above, the control circuit board 90 is electrically connected to the wiring board unit 21 (i.e., the first FPC unit 40A and the second FPC unit 40B) via the connector 80D, the connector unit 50, and the first and second connectors 45a and 45b, and is further electrically connected to the magnetic heads 17 and the voice coil 36 of the first head actuator 22A and the magnetic heads 17 and the voice coil 36 of the second head actuator 22B via the wiring board unit 21.

According to the present embodiment structured as described above, it is possible to obtain the HDD with the connecting device by which ease of assembly is improved. That is, according to the present embodiment, by adopting a structure that allows the first support 54 of the first FPC unit 40A and the second support 44 of the second FPC unit 40B, which make up the connecting device, to be coupled to each other and can bring about the engagement therebetween, at the time of assembly of the HDD, it is possible to treat the first support 54 and the second support 44 as one part by coupling the second support 44 to the first support 54 and holding the second support 44 thereby. This makes it possible to, for example, connect the first connector 45a and the second connector 45b to the first junction connectors 50b concurrently in one operation and improve ease of assembly. Moreover, by providing a pressing portion that presses the second support 44 against the first support 54, by just pressing the first support 54 toward the casing 10 and fixing the first support 54 to the casing 10 when connecting the first connector 45a and the second connector 45b to the first junction connectors 50b, it is also possible to press the second support 44 toward the casing 10 and connect the second connector 45b to the first junction connector 50b. This eliminates the need to fix the second support 44 to the casing 10 and can improve ease of assembly.

Furthermore, according to the present embodiment, in a state in which the second support 44 is coupled to the first support 54, the first connector 45a and the second connector 45b are located side by side in almost the same plane. This makes it possible to connect the first connector 45a and the second connector 45b directly to the first junction connectors 50b of the connector unit 50. There is no need to provide another junction connector between the first connector 45a and the first junction connector 50b and between the second connector 45b and the first junction connector 50b, which makes it possible to reduce the number of connectors that are installed. By reducing the number of parts in this way, further improvement in ease of assembly can be achieved.

According to the present embodiment, the first FPC 52 and the second FPC 42 are structured so that the length of each trace W1 and the length of each trace W2 are nearly equal. As a result, the impedance of the traces W1 and the impedance of the traces W2 are approximately equal to each other, which makes it possible to implement the connecting device that can transfer data to a multi-head actuator at high speed.

Thus, according to the present embodiment, it is possible to provide the connecting device by which ease of assembly is improved and the disk device including this connecting device.

For example, the number of head actuators is not limited to two: the first and second head actuators; a structure with three or more head actuators can also be adopted. In this case, it is only necessary to adopt a structure in which as many FPC units as head actuators are provided and supports of the FPC units can be coupled to each other. The number of magnetic disks is not limited to six; the number of magnetic disks may be seven or more or five or less. The number of head suspension assemblies and the number of magnetic heads can also be increased or decreased in accordance with the number of magnetic disks that are installed. The materials for the elements that constitute the disk device and the shapes, sizes, and so forth of these elements are not limited to those of the above-described embodiment and can be changed in various ways when necessary.

Moreover, the above-described embodiment deals with a fitting-type connector; however, a connector is not limited to this type and a compression-type connector configuration in which a connector is directly pressed against a pad by a spring can also be used.

In the above-described embodiment, the device configuration of a 3.5-inch HDD, which is assumed to be 101.85 mm wide, 147 mm long, and 26.1 mm high, is shown. However, the device configuration is not limited thereto; as long as magnetic disks are mounted on one spindle motor, the height may be 42 mm or 84 mm or any other configuration whose dimensions are different from those described above may be adopted.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A connecting device comprising: a first flexible printed circuit including a bonding end in which a plurality of connecting pads are provided, a first base portion, a junction portion extending between the bonding end and the first base portion, and a plurality of traces extending from the first base portion to the bonding end; a first connector that is mounted on the first base portion; a second flexible printed circuit including a bonding end in which a plurality of connecting pads are provided, a second base portion, a junction portion extending between the bonding end and the second base portion, and a plurality of traces extending from the second base portion to the bonding end; and a second connector that is mounted on the second base portion, wherein the first connector and the second connector are disposed side by side in a same plane, wherein a first support that is attached to the first base portion and supports the first connector, and a second support that is attached to the second base portion and supports the second connector.

2. The connecting device according to claim 1, wherein the first support includes a first engaging portion that engages the second support and a housing space portion that houses at least part of the second support, and
the second support includes a second engaging portion with which the first engaging portion is brought into engagement, and is held by the first support in a state in which at least part of the second support is disposed in the housing space portion and the first engaging portion is in engagement with the second engaging portion.

3. The connecting device according to claim 2, wherein the first support includes a first pressing portion that presses the second support toward the second connector, and
the second support includes an abutment portion that abuts the first pressing portion.

4. The connecting device according to claim 3, wherein the first support comprises a main body including a bottom face, a top face opposite to the bottom face, and a first side face that intersects the bottom face, and a side plate including a second side face extending in a direction intersecting the bottom face, and the first engaging portion includes an engaging arm extending from the side plate.

5. The connecting device according to claim 4, wherein the first pressing portion includes a pressing arm that extends from the main body and is elastically deformable.

6. The connecting device according to claim 5, wherein the first base portion of the first flexible printed circuit is fixed to the bottom face and the second side face of the first support, and the first connector is placed on the bottom face with the first base portion sandwiched therebetween.

7. The connecting device according to claim 6, wherein the second support comprises a main body including a bottom face and a top face opposite to the bottom face, and a side plate including a side face that intersects the bottom face, and the second engaging portion includes an engaging recess portion formed in the main body.

8. The connecting device according to claim 7, wherein the second base portion of the second flexible printed circuit is fixed to the bottom face and the side face of the second support, the second connector is placed on the bottom face with the second base portion sandwiched therebetween, and the bottom face of the first support and the bottom face of the second support are located side by side in a same plane in a state in which the second support is held by the first support.

9. The connecting device according to claim 8, wherein the abutment portion of the second support includes a positioning recess formed in the top face of the main body.

10. The connecting device according to claim 1, wherein a length of a trace of the first flexible printed circuit is equal to a length of a trace of the second flexible printed circuit.

11. A disk device comprising: a casing; a plurality of magnetic disks disposed in the casing; a plurality of head actuators that include magnetic heads and are rotatably provided in the casing; and a connecting device provided in the casing and connected to the plurality of head actuators, the connecting device including: a first flexible printed circuit including a bonding end in which a plurality of connecting pads are provided, a first base portion, a junction portion extending between the bonding end and the first base portion, and a plurality of traces extending from the first base portion to the bonding end; a first connector that is mounted on the first base portion; a second flexible printed circuit including a bonding end in which a plurality of connecting pads are provided, a second base portion, a junction portion extending between the bonding end and the second base portion, and a plurality of traces extending from the second base portion to the bonding end; and a second connector that is mounted on the second base portion, wherein the first connector and the second connector are disposed side by side in a same plane, wherein the connecting device further comprises a first support that is attached to the first base portion and supports the first connector, and a second support that is attached to the second base portion and supports the second connector.

12. The disk device according to claim 11, wherein the first support includes a first engaging portion that engages the second support and a housing space portion that houses at least part of the second support, and the second support includes a second engaging portion with which the first engaging portion is brought into engagement, and is held by the first support in a state in which at least part of the second support is disposed in the housing space portion and the first engaging portion is in engagement with the second engaging portion.

13. The disk device according to claim 12, wherein the first support includes a first pressing portion that presses the second support toward the second connector, and the second support includes an abutment portion that abuts the first pressing portion.

14. The disk device according to claim 13, wherein the first support comprises a main body including a bottom face, a top face opposite to the bottom face, and a first side face that intersects the bottom face, and a side plate including a second side face extending in a direction intersecting the bottom face, and the first engaging portion includes an engaging arm extending from the side plate.

15. The disk device according to claim 14, wherein the first pressing portion includes a pressing arm that extends from the main body and is elastically deformable.

16. The disk device according to claim 15, wherein the first base portion of the first flexible printed circuit is fixed to the bottom face and the second side face of the first support, and the first connector is placed on the bottom face with the first base portion sandwiched therebetween.

17. The disk device according to claim 16, wherein the second support comprises a main body including a bottom face and a top face opposite to the bottom face, and a side plate including a side face that intersects the bottom face, and the second engaging portion includes an engaging recess portion formed in the main body.

18. The disk device according to claim 17, wherein the second base portion of the second flexible printed circuit is fixed to the bottom face and the side face of the second support, the second connector is placed on the bottom face with the second base portion sandwiched therebetween, and the bottom face of the first support and the bottom face of the second support are located side by side in a same plane in a state in which the second support is held by the first support.

* * * * *